United States Patent
Bullock et al.

(10) Patent No.: US 6,456,192 B1
(45) Date of Patent: Sep. 24, 2002

(54) METHOD AND SYSTEM FOR POWER LINE NULL DETECTION AND AUTOMATIC FREQUENCY AND GAIN CONTROL

(75) Inventors: Scott R. Bullock, South Jordan; Ryan Hoobler, West Valley City; David Bartholomew, West Valley, all of UT (US)

(73) Assignee: Phonex Broadband Corporation, Midvale, UT (US)

(*) Notice: Subject to any disclaimer, the term of this patent is extended or adjusted under 35 U.S.C. 154(b) by 0 days.

(21) Appl. No.: 09/553,421

(22) Filed: Apr. 19, 2000

(51) Int. Cl.[7] ............................................. H04M 11/04
(52) U.S. Cl. ....................... 340/310.01; 340/310.02; 340/310.03; 375/259
(58) Field of Search ................. 340/310.01, 310.02, 340/310.03; 375/327, 254, 259, 296

(56) References Cited

U.S. PATENT DOCUMENTS

| | | | |
|---|---|---|---|
| 4,668,934 A | 5/1987 | Shuey | 340/310 A |
| 4,715,045 A | 12/1987 | Lewis et al. | 375/58 |
| 4,912,553 A | 3/1990 | Pal et al. | 358/86 |
| 5,195,098 A | 3/1993 | Johnson et al. | 371/37.2 |
| 5,210,518 A | 5/1993 | Graham et al. | 340/310 R |
| 5,260,974 A | 11/1993 | Johnson et al. | 375/76 |
| 5,264,823 A | 11/1993 | Stevens | 340/310 A |
| 5,289,476 A | 2/1994 | Johnson et al. | 371/37.1 |
| 5,289,498 A | 2/1994 | Hurlbut et al. | 375/1 |
| 5,355,114 A | 10/1994 | Sutterlin et al. | 340/310 A |
| 5,377,227 A | 12/1994 | Hurlbut et al. | 375/1 |
| 5,559,377 A | 9/1996 | Abraham | 307/104 |
| 5,625,863 A | 4/1997 | Abraham | 455/3.3 |
| 5,705,974 A | 1/1998 | Patel et al. | 340/310.08 |
| 5,717,685 A | 2/1998 | Abraham | 370/30 |
| 5,805,053 A | 9/1998 | Patel et al. | 340/310.01 |
| 5,818,127 A | 10/1998 | Abraham | 307/106 |
| 5,841,807 A | 11/1998 | Hannebauer et al. | 375/206 |
| 5,933,415 A * | 8/1999 | Huloux | 370/252 |
| 6,249,213 B1 * | 3/2001 | Horne et al. | 340/310.01 |

* cited by examiner

Primary Examiner—Donnie L. Crosland
(74) Attorney, Agent, or Firm—Lloyd W. Sadler

(57) ABSTRACT

A system and method for detecting power line null frequencies and for adjusting the transmit frequency and transmit power to maximize the reliability and efficiency of the AC power line transmission link is described. This invention uses a programmable logic device in the transmitter, which transmits multiple frequencies to a receiver. The receiver detects and records the bit error rate and/or the received noise per frequency and communicates this information to the transmitter. When all desired frequencies have been transmitted and tested, the optimal frequency is identified or selected. Generally, the optimal frequency is the frequency requiring the lowest transmit power while maintaining an acceptable bit error rate or an acceptable noise level.

4 Claims, 3 Drawing Sheets

METHOD AND SYSTEM FOR POWER LINE NULL DETECTION AND AUTOMATIC FREQUENCY AND GAIN CONTROL

BACKGROUND OF THE INVENTION

1. Field of the Invention

This invention relates to the transmission of communication signals over the AC power line. More particularly, this invention relates to the improvement in signal transmission efficiency through the detection and selection of a transmission frequency selected to avoid power line noise and the like.

2. Description of the Related Art

A variety of techniques have been proposed to address the problem of power line noise, mismatches, and signal attenuation. Typically such techniques involve filtering, signal power amplification and/or transmission over multiple frequencies. These prior techniques all suffer from transmission inefficiency.

For general background material the reader is directed to the following U.S. patents each of which is incorporated in its entirety for the material contained therein.

U.S. Pat. No. 4,668,934 describes a receiver apparatus for three-phase power line carrier communications, in which each phase conductor is coupled to a common point that is connected in signal communication with an input to a receiver.

U.S. Pat. No. 4,715,045 describes a system protocol for the composite shift key communication of binary signals in which a transmitting transceiver transmits a first summed signal having a first qualifying signal at a qualifying signal frequency as one of the summed signal components only when a binary signal is desired to be transmitted.

U.S. Pat. No. 4,912,553 describes a wideband video system that transmits and receives video signals through a ground line of a power distribution network.

U.S. Pat. No. 5,195,098 describes a binary data error correction method and apparatus, which permits the correction of double errors using a Hamming code and a parity bit.

U.S. Pat. No. 5,210,518 describes an apparatus and method for reducing errors in data caused by noise in a power line communication system.

U.S. Pat. No. 5,260,974 describes an apparatus, which uses a carrier detection threshold level for detecting a carrier signal modulated with binary data.

U.S. Pat. No. 5,264,823 describes a power line communication system wherein data is transmitted on a power line as a momentary interruption of the power at or near the zero crossing of the current.

U.S. Pat. No. 5,289,476 describes a power line communication-apparatus wherein transmission mode information is encoded into each data packet while maintaining immunity from single bit errors.

U.S. Pat. No. 5,289,498 describes a method and means for recovering data in a spread spectrum communications system using adaptive data recovery techniques.

U.S. Pat. No. 5,355,114 describes a power line communication apparatus where data is redundantly transmitted on a first and a second carrier where the carriers are separated by a predetermined number of Hz.

U.S. Pat. No. 5,377,227 describes a method and means for recovering data in a spread spectrum communications system, that includes a method and means for providing a sync window time period.

U.S. Pat. No. 5,559,377 describes an apparatus for electrical line communication that includes a coupler at each of two or more locations along a pair of lines, the coupler having capacitive circuits serially connected with an air-core transformer.

U.S. Pat. No. 5,625,863 describes a cable television/video distribution and selection system for distributing video signals throughout a home or building over in-wall electrical wiring.

U.S. Pat. No. 5,705,974 describes a coupling circuit for a power line communications system for coupling information signals from a transmitter unit to a power line and for coupling information signals from the power line to a receiver unit.

U.S. Pat. No. 5,717,685 describes an apparatus for electrical line communication that includes a coupler at each of two or more locations along a pair of lines, the coupler having capacitive circuits serially connected with an air-core transformer.

U.S. Pat. No. 5,805,053 describes an electrical appliance in which a power line adapter unit is embodied by which information signals are conducted to and from a power line from and to the appliance along the same connection to the power line by which the appliance is powered.

U.S. Pat. No. 5,818,127 describes an apparatus for electrical line communications using FM video modulation that includes FM video modulation circuits and an impedance matching coupler at each of two or more locations along a pair of lines.

U.S. Pat. No. 5,841,807 describes a spread spectrum data communicator, which has a plurality of transmitters for uni-directionally simultaneously transmitting, through a transmission medium to a single receiver, a plurality of data streams.

SUMMARY OF THE INVENTION

It is desirable to provide a method and system for the detection of signal mismatches and reflections on an AC power line being used for communications. In particular, it is desirable to provide a method and system, which compensates for signal attenuation on an AC power line by selecting a frequency channel and adjusting the signal power to a level needed for reliable transmission of the signal over the power line.

Therefore, it is the general object of this invention to provide a method and system for detecting the signal attenuation on an AC power line being used for a communication channel.

It is a further object of this invention to provide a method and system, which can detect the noise on a power line at a given frequency.

It is a still further object of this invention to provide a method and system for determining the signal power needed for a reliable transmission link.

Another object of this invention is to provide a method and system for selecting a channel frequency having reduced noise.

A further object of this invention is to provide a method and system for selecting a channel frequency having reduced attenuation.

A still further object of this invention is to provide a method and system for improving the transmission reliability in an AC power line communication channel.

Still another object of this invention is to provide a method and system for making an AC power line communication channel RF spectrum efficient.

Another object of this invention is to provide a method and system for improving the quality of signal transmission over an AC power line that is compatible with either analog or digital transmission techniques.

These and other objects of this invention are achieved by the method and system herein described and are readily apparent to those of ordinary skill in the art upon careful review of the following drawings, detailed description and claims.

BRIEF DESCRIPTION OF THE DRAWINGS

In order to show the manner that the above recited and other advantages and objects of the invention are obtained, a more particular description of the preferred embodiment of the invention, which is illustrated in the appended drawings, is described as follows. The reader should understand that the drawings depict only some preferred embodiments of the invention, and are not to be considered as limiting in scope. A brief description of the drawings is as follows.

DETAILED DESCRIPTION OF THE INVENTION

This invention is a method and system for improving the reliability and efficiency of transmission in an AC power line RF communication system. Each AC power line has a unique transfer function. These transfer functions typically have very high peaks and very low valleys, which are caused by mismatches on the AC power line as well as reflected signals. During transmission over the AC power line, if the selected transmission frequency happens to fall in one of the valleys, the level of attenuation is high and additional power is required in order to provide a good communication link. Alternatively, if the selected transmission frequency happens to fall in one of the peaks, then more power is transmitted than is necessary to provide a reliable communication link. In either event, the communication link is less than optimally efficient. Moreover, AC power lines often have noise and interference from jamming signals, from the airwaves or other units plugged into the power line. It is desirable to move the communication link away from the noise, interference, and high attenuation valleys and to thereby improve the quality and efficiency of the communication link.

This invention uses the concept that radios can check multiple frequencies to identify an optimal frequency channel and can then use the channel that requires the least power to make the communication link reliable. This invention, thereby, makes the communication link RF spectrum efficient. This invention works equally well with digital or analog transmission methods.

Figure 1:
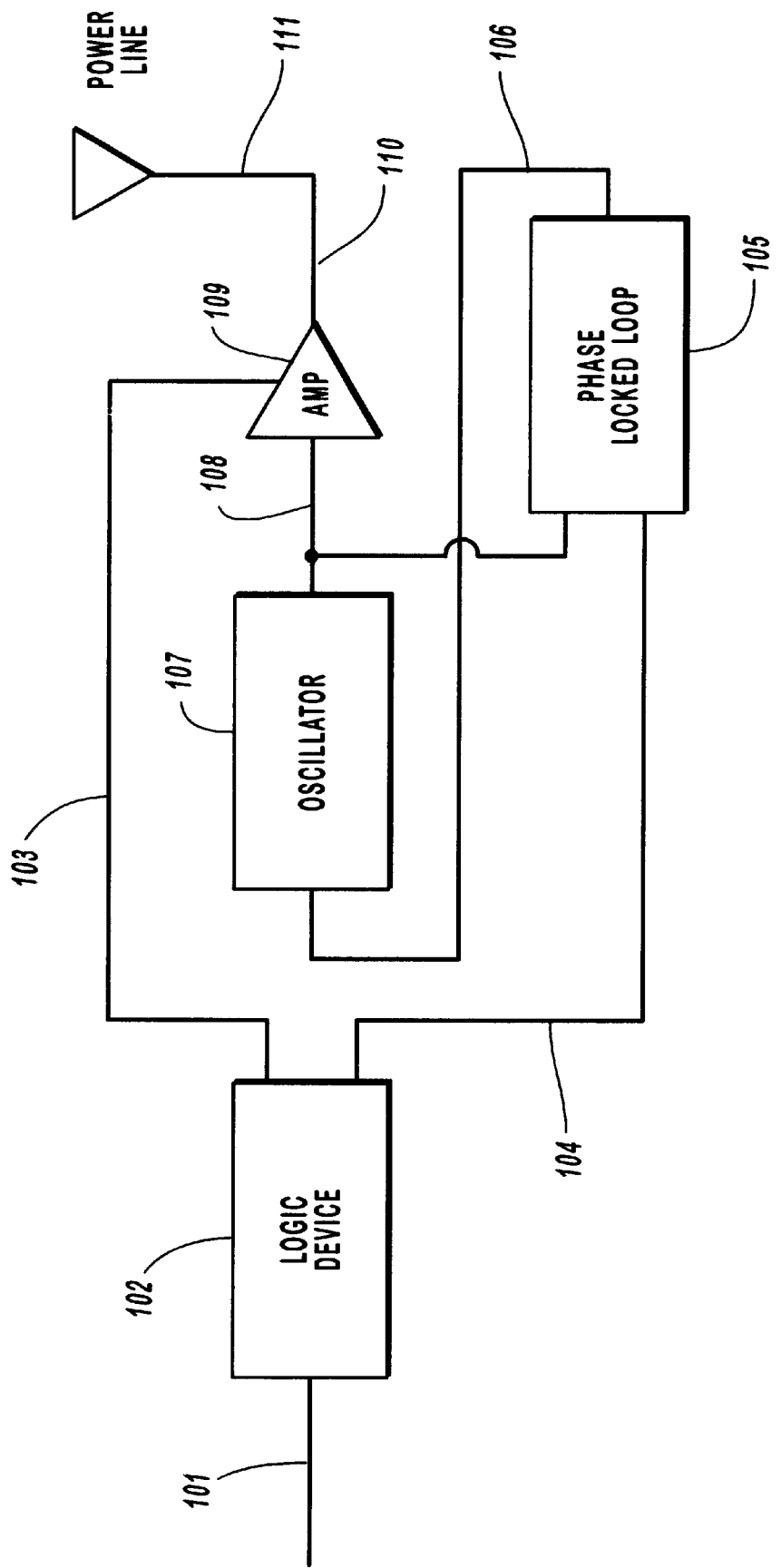
FIG. 1 is a top-level block diagram of the preferred transmitter system of this invention.

FIG. 1 shows a top-level block diagram of the preferred transmitter of this invention. This system employees a Phase-Locked-Loop (PLL) 105 used with a controllable gain amplifier 109. The PLL 105 selects the different frequencies while the amplifier 109 is adjusted to select the appropriate output power level. The control for the amplifier 109 is provided by a logic device 102, which could be a microcontroller, digital signal processor and/or programmable gate array and the like. The logic device 102 receives information 101 and generates a control signal 103, which controls the gain of the amplifier 109. The logic device 102 also provides the PPL control signal 104 for directing the PPL 105 in its selection of frequencies. The PPL 105 receives a feed back signal 108 from an oscillator and produces an oscillator input signal 106. The amplifier 109 is connected to the oscillator to receive the desired frequency signal 108. The output 110 of the amplifier 109 is connected to the power line 111.

Figure 2:
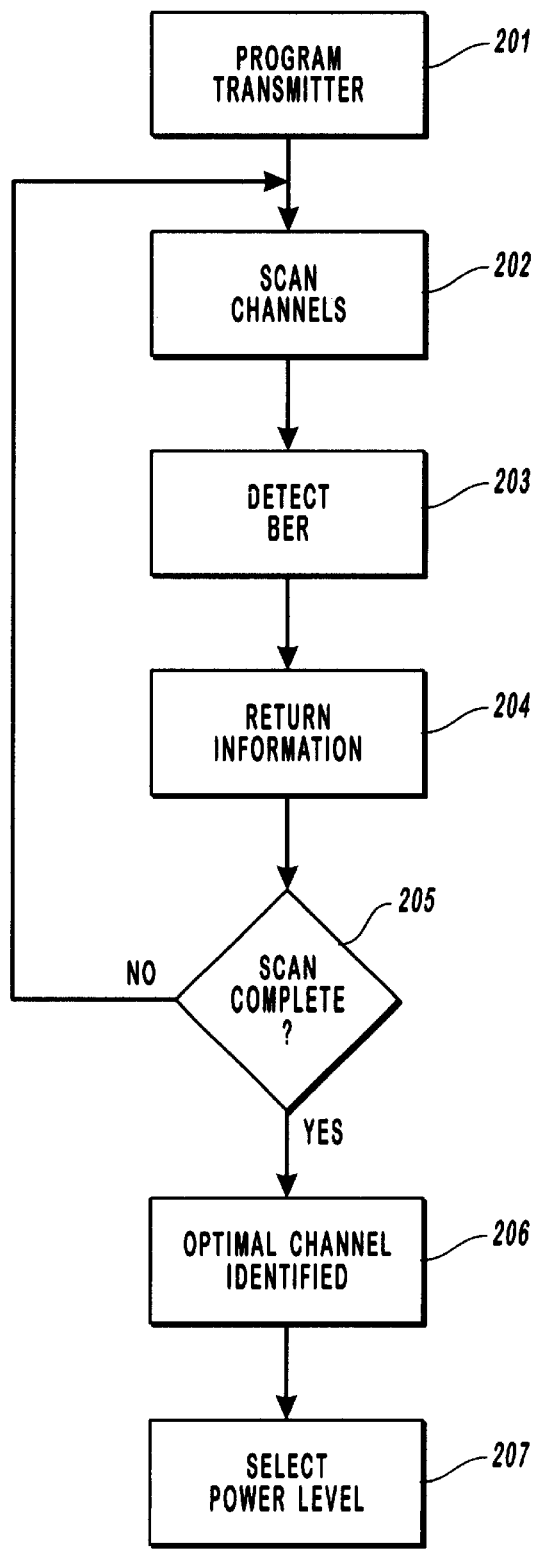
FIG. 2 is a first preferred method of determining the characteristics of the power line of this invention.

FIG. 2 shows the first preferred method of this invention, which measures and compares the bit error rate to the received power. Initially the transmitter is programmed 201 to scan channels at different output power levels. The channels are scanned 202 to find the channel with the highest acceptable bit error rate at the lowest output power. When a channel is scanned the bit error rate 203 is detected by the receiver. Information containing the bit error rate and the received power is sent 204 from the receiver to the transmitter. The higher the received power and the lower the bit error rate, the more optimal the frequency selection. If the scan is not complete 205 the next channel is scanned 202 and the process continues. If the scan is complete then the optimal channel is identified 206. Lastly, the transmission power level is selected 207 to the lowest level, which maintains a reliable transmission link.

Figure 3:
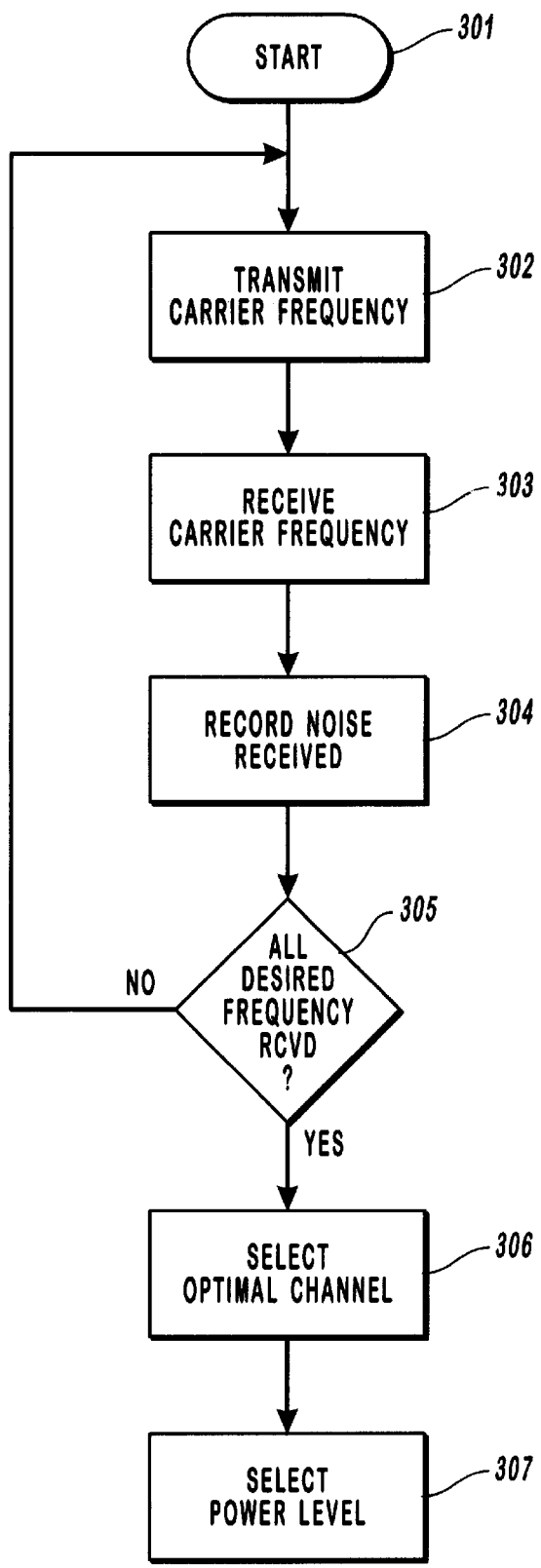
FIG. 3 is a second preferred method of determining the characteristics of the power line of this invention.

FIG. 3 shows an alternative preferred method of this invention, which measures the amount of noise received. This alternative starts 301 with the carrier frequency being transmitted 302 by the transmitter. The receiver receives 303 the carrier frequency and records 304 the noise received. This process is repeated 305 for all desired frequencies. When all desired frequencies have been transmitted 302 and received 303, the optimum channel is selected 306. The optimal channel is the one with the highest acceptable noise level at the lowest output power. Lastly, the transmission power level is selected 307 to the lowest level, which maintains a reliable transmission link.

In some applications of this invention, the channel would only be selected once, while in other alternatives, channel selection can be occurring constantly.

The described embodiments are to be considered in all respects only as illustrative and not as restrictive. Although the embodiments shown here use particular components and order of steps, the invention is not limited thereto. The scope of this invention is indicated by the appended claims rather than by the foregoing description, which is provided to describe the best mode of the invention envisioned by the inventors. All changes that come within the meaning and range of equivalency of the claims are to be embraced as being within their scope.

We claim:

1. A system for the detection and selection of a optimal power line transmission frequency, comprising:
   a transmitter, said transmitter further comprising:
   (A) a logic device receiving information from a receiver;
   (B) a phase locked loop connected to said logic device for selecting a desired transmission frequency;
   (C) an oscillator receiving a frequency control signal from said phase locked loop;
   (D) a controllable gain output amplifier receiving a control signal from said logic device and receiving a carrier frequency signal from said oscillator; and
   (E) a connection to an AC power line channel, said connection electrically connected to said controllable gain output amplifier.

2. A method for identifying an optimal frequency for AC power line communication, comprising:

(A) programming a transmitter;

(B) scanning a channel frequency;

(C) detecting a bit error rate of said scanned channel frequency;

(D) returning information from a receiver to said programmed transmitter;

(E) testing for scan complete;

(F) identifying an optimal channel; and (G) selecting the lowest power level required for a reliable transmission link.

3. A method for identifying an optimal frequency for AC power line communication, as recited in claim 2, wherein said identifying an optimal channel further comprises selecting a channel based on said bit error rate.

4. A method for identifying an optimal frequency for AC power line communication, comprising:

(A) transmitting a carrier frequency from an transmitter to a receiver;

(B) receiving a carrier frequency by said receiver from said transmitter;

(C) recording noise received by said receiver;

(D) checking if all desired frequencies have been transmitted and received;

(E) selecting an optimal carrier frequency based on said received noise recorded by said receiver; and (F) select power level required for reliable transmission link.

* * * * *